US00RE36264E

United States Patent [19]

Merritt et al.

[11] E Patent Number: Re. 36,264

[45] Reissued Date of Patent: Aug. 3, 1999

[54] READ CIRCUIT FOR ACCESSING DYNAMIC RANDOM ACCESS MEMORIES (DRAMS)

[75] Inventors: Todd A. Merritt, Boise; Greg A. Blodgett, Nampa, both of Id.

[73] Assignee: Micron Technology, Inc., Boise, Id.

[21] Appl. No.: 08/684,338

[22] Filed: Jul. 19, 1996

Related U.S. Patent Documents

Reissue of:

[64] Patent No.: 5,331,593
Issued: Jul. 19, 1994
Appl. No.: 08/025,554
Filed: Mar. 3, 1993

[51] Int. Cl.[6] ..... H03K 17/08

[52] U.S. Cl. ..... 365/189.11; 365/189.05

[58] Field of Search ..... 365/189.05, 189.11, 365/230.08; 326/56, 57, 58

[56] References Cited

U.S. PATENT DOCUMENTS

| | | | |
|---|---|---|---|
| 4,769,561 | 9/1988 | Iwamura et al. | 326/110 |
| 4,779,014 | 10/1988 | Masuoka et al. | 326/110 |
| 4,825,102 | 4/1989 | Iwasawa et al. | 327/546 |
| 5,099,138 | 3/1992 | Fukumaga | 327/109 |
| 5,159,214 | 10/1992 | Okumura | 326/110 |
| 5,311,076 | 5/1994 | Park et al. | 365/189.05 |
| 5,384,735 | 1/1995 | Park et al. | 365/189.05 |

*Primary Examiner*—Vu A. Le
*Attorney, Agent, or Firm*—Trask, Britt & Rossa

[57] ABSTRACT

DRAM read accessing circuitry having two parallel connected control lines, one of which includes a level translator stage and the other of which includes an enable gate. Both the level translator stage and the enable gate are connected to receive 0.0 to 3 volt small logic swings from output buffer logic utilized in reading data out of the DRAM. Output signals from the level translator stage are applied to a pull up output transistor in an output driver stage, and output signals from the enable gate are connected to a pull down output transistor in the output driver stage. A feedback connection is provided between the output of the level translator stage and one input to the enable gate to ensure that the enable gate does not generate an enabling output signal for turning on the pull down output transistor until the pull up output transistor is completely turned off. Not only does this novel operation completely eliminate crossing or crossover currents in the output driver stage, but it also introduces minimum time delays in logic swings at the output node of the output driver stage.

26 Claims, 2 Drawing Sheets

READ CIRCUIT FOR ACCESSING DYNAMIC RANDOM ACCESS MEMORIES (DRAMS)

Matter enclosed in heavy brackets [ ] appears in the original patent but forms no part of this reissue specification; matter printed in italics indicates the additions made by reissue.

TECHNICAL FIELD

This invention relates generally to access circuitry for reading digital data stored in dynamic random access memories (DRAMs) and more particularly to such circuitry having improved power conservation and switching characteristics especially well suited for the extended data out mode of DRAM read operation.

BACKGROUND ART

Many different types of circuits and systems have been developed in the past for reading and writing data into a DRAM which comprises a predetermined number of rows and columns of individual memory cells. One such system is disclosed, for example, in U.S. Pat. No. 5,148,546, entitled "Method and System for Minimizing Power Demands on Portable Computers and the Like by Refreshing Selected DRAM Ceils" and issued to Greg A. Blodgett. This patent is assigned to the present assignee and is incorporated herein by reference.

In the past, it was customary to use the conventional 0.0 and 5 volt digital logic levels to define the logic swing for accessing these DRAM cells. More recently, DRAM access level translating circuitry has been developed which operates to convert the above 0.0 to 5 volt logic swing down to 3 volts used in switching these access transistors in order to conserve power in the DRAM. This level translating circuitry also serves to reduce certain metal-oxide-silicon (MOS) processing requirements, such as reducing MOS gate oxide thicknesses which were required to handle to the larger 0.0 to 5 volt logic swing. Thus, this level translating circuitry is operative to convert the 0.0 to 5 volt logic swing to a 0.0 to 3 volt logic swing prior to writing data into the DRAM. Further the level translator circuit is operative to convert the 0.0 to 3 volt logic swing back to a 0.0 to 5 volt logic swing in the process of reading data from the DRAM and applying it to external circuitry to boost a gate voltage of an NPN output buffer transistor in order to drive a full supply potential of the output buffer to an output node. In the present example if $V_{cc}$ is 3 volts the gate voltage is boosted to 5 volts by a level translator. In a further example if $V_{cc}$ is 5 volts the gate voltage is boosted to 7 volts.

This level translating circuitry is normally connected in one of two signal paths used for reading data from a DRAM and when operating in the well known "Extended Data Out" mode for video RAMs (VRAMs) or for synchronous DRAMs or "SDRAMs". Using this mode of operation, the elimination of crossing currents in output MOS buffer transistors is particularly critical since the output data can switch states with no shut off period in between.

Access circuitry for reading data from the DRAM will typically include a large plurality of data channels, e.g. sixteen, each of which includes a pair of parallel connected data processing control lines or paths. One of these paths will include the above level translating stage used for converting the 3 volt logic swing to a 5 volt logic swing and then applying it to an output pull up MOS buffer transistor. This output pull up MOS transistor is normally connected in series to an MOS pull down transistor and between a $V_{cc}$ supply voltage and ground potential. The common node interconnecting the pull up and the pull down transistors is the point where the output signal from each channel is taken, and the pull down transistor is connected to be driven by the second control line or signal processing path which in turn is connected in parallel with the level translating stage.

These level translating stages in each read channel introduce time delays into the signals being processed in this one signal path of each channel and thereby make it necessary to introduce an even longer time delay in the other parallel signal path of each signal channel which feeds the pull down MOS transistor in the output driver stage. This latter requirement is necessary in order to ensure that the above pull up and pull down transistors in the output driver stage are not conducting at the same time, and that their crossing or cross-over currents are minimized or eliminated.

The problem and disadvantage of using fixed delays in this other parallel signal path or control line driving the pull down transistor is that these fixed delays must always be longer than actually required in order to ensure that the pull down transistor is never turned on until the pull up transistor is completely turned off. This latter requirement is necessary as a result of variations in MOS wafer processing and MOS process tolerances, and it represents an undesirable time delay in accessing the DRAM. It also imposes an undesirable limitation on the maximum achievable switching speeds and data processing capability for this access circuitry. Accordingly, it is the solution to the above problems to which the present invention is directed.

SUMMARY OF THE INVENTION

The general purpose and principal object of the present invention is to provide a new and improved output buffer stage for a DRAM accessing system. This buffer stage completely eliminates the above undesirable time delay when accessing and reading the DRAM using reduced logic swings or levels which have been level translated in order to conserve power in operating the DRAM.

Another object of this invention is to provide a new and improved output buffer stage of the type described which is operative to increase data processing capability when reading data from the DRAM.

Another object of this invention is to provide a new and improved output buffer stage of the type described which is operative to eliminate crossing currents and minimize signal delays in the DRAM read circuitry.

Another object of this invention is to provide a new and improved buffer stage of the type described which makes the crossover switching time for the output logic swings from the buffer stage independent of MOS process variations and tolerances which may be characteristic of the integrated circuit fabrication processes used.

To accomplish the above purpose and objects, there has been developed a new and improved output buffer stage for a DRAM, and this buffer stage is used in each DRAM input/output (I/O) channel for minimizing signal delays and reducing crossing currents. This stage includes first and second control lines operative to generate, respectively, first and second complementary output logic swings, and a level translating stage is connected in a first control line and between the DRAM and one input to a pull up driver transistor. A second parallel control line is connected between the DRAM and a pull down transistor in the output buffer stage. The present method is characterized by enabling the operation of the second parallel control line by an output voltage derived from the level translating stage in the first control line to thereby ensure that the pull down output transistor is turned on immediately after the pull up output transistor is turned off, but not before.

In a preferred circuit embodiment of the invention, there is provided circuitry for driving the serially connected pull up and pull down output transistors to generate an output logic swing which has been up-converted from a smaller input logic swing. This circuitry includes the level translating stage which is connected to receive a small pull up logic swing and is operative to convert it to a larger output pull up logic swing. Additional MOS driver circuit means are connected between an output line from the level translator stage to the pull up transistor for applying this larger output logic swing to the pull up output transistor. An enable gate is connected in the second parallel signal processing control line or path and has one input thereof connected to be driven by the output logic swing from the output line of the level translator stage. Thus, the enable gate is operative to turn on the pull down output transistor only after the logic swing on the output line from the level translator stage switches levels to thereby turn off the pull up output transistor. This novel operation thus eliminates any crossing current in the series circuit output connection including the pull up and pull down output transistors. This feature further ensures that this complementary switching action does not introduce any unnecessary time delays in the process of reading data out of the DRAM array, and is particularly useful in the extended data out mode of operation.

The above brief summary of the invention, together with its various objects, novel features and related advantages will become better understood with reference to the following description of the accompanying drawings.

BRIEF DESCRIPTION OF THE DRAWINGS

FIG. 2 shows the circuit details for the output buffer and output driver stages of the functional block system shown in FIG. 1.

DETAILED DESCRIPTION OF THE DRAWINGS

Figure 1:
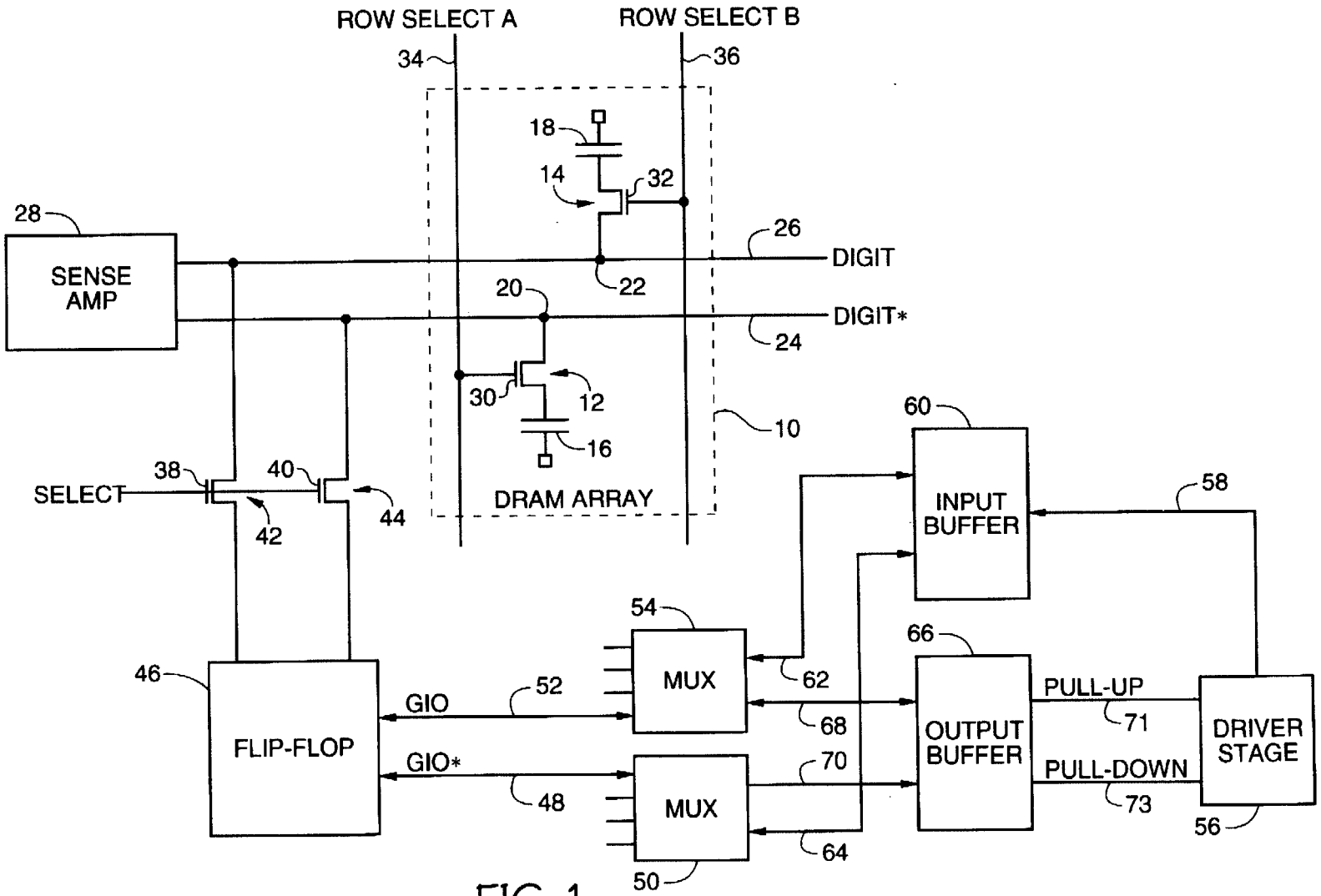
FIG. 1 shows a read/write electrical system for accessing a DRAM, and it utilizes the access buffer read circuitry according to the present invention.

Referring now to FIG. 1, there is shown a DRAM array represented by the dotted line functional block 10, and this array will typically include a large plurality of access transistors. Only two of these transistors 12 and 14 are shown in FIG. 1. Each access transistor 12 and 14 is connected to the remaining integrated circuit storage cell represented functionally by the two capacitors 16 and 18.

The MOS access transistors 12 and 14 have their drain contacts 20 and 22 connected as shown to a pair of digit lines 24 and 26 at the outputs of a sense amplifier 28, and the gate electrodes 30 and 32 of the two access transistors 12 and 14 are connected to the row select word lines 34 and 36 in the usual manner well known to those skilled in the art. The cell column selection for the DRAM array 10 is provided by the application of column select signals to the gate electrodes of a pair of column select MOS transistors 42 and 44, and the column select transistors 42 and 44 are connected in parallel as shown to a flip flop stage 46. This flip flop stage 46 is operative in two stable states during either the reception of output data from the DRAM array 10 and applying it to the two multiplexing stages 50 and 54 or during data entry into the DRAM 10 by receiving data on lines 48 and 52 from the two multiplexing stages 50 and 54.

The lines or nodes 48 and 52 in FIG. 1 are common input/output (I/O) signal lines and they are both used for reading and writing data from and to the DRAM array 10. The use of the asterisk (*) denotes a complementary signal as shown in FIG. 1.

Figure 2:
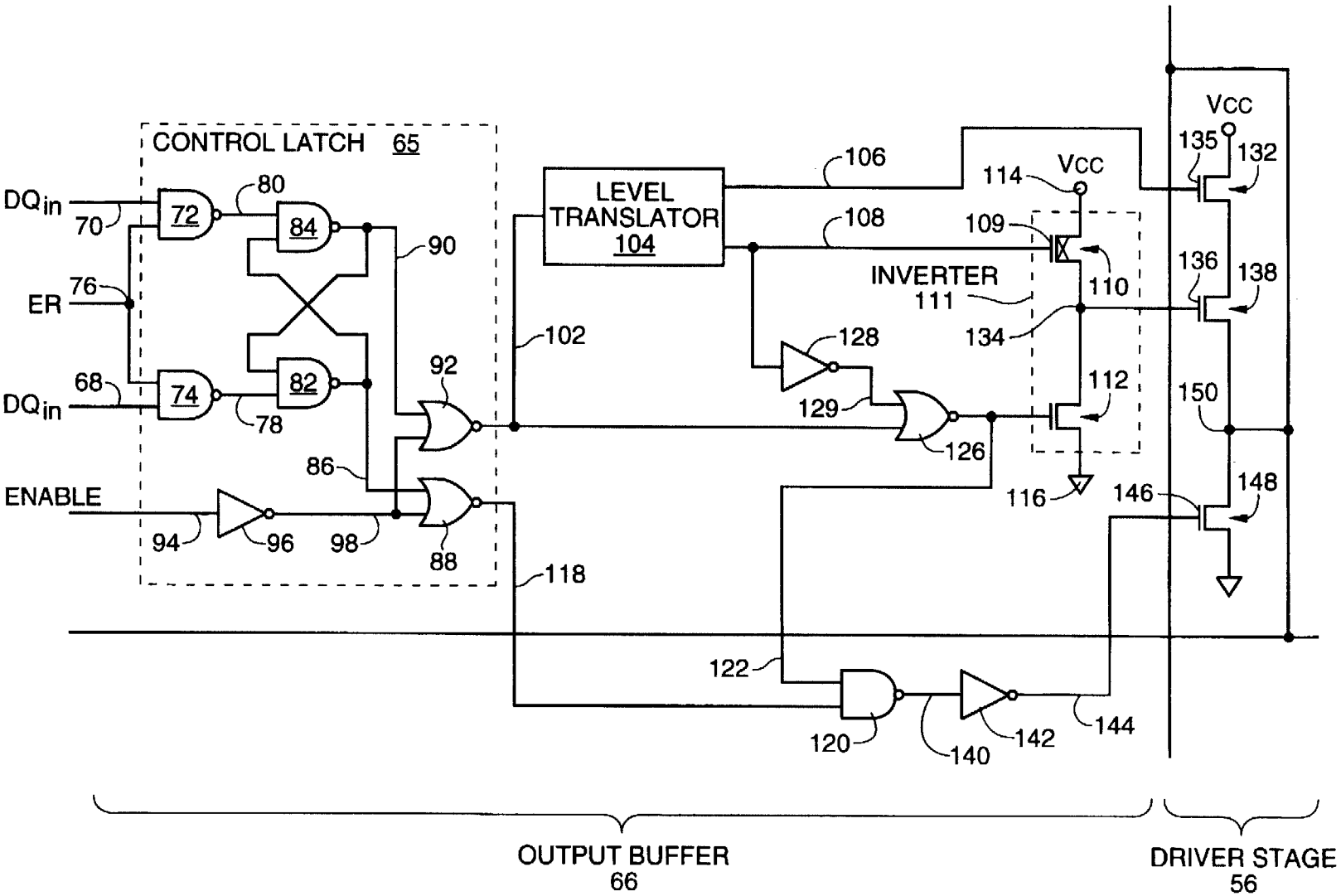
FIG. 2 is a schematic diagram of the access buffer DRAM read circuitry according to a preferred embodiment of the invention.

The input data and output data for the DRAM array 10 both originate in and is received by a DQ driver stage 56, also referred to herein as the output driver stage in describing the circuit embodiment shown in FIG. 2. Input data originating in the DQ driver stage 56 is applied via output line 58 as an input signal to the input buffer stage 60. The input buffer stage 60 has one of its outputs 62 connected as shown as one input to the multiplexing stage 54, whereas the other output 64 of the input buffer stage 60 is connected to drive one input of the other multiplexing stage 50.

The input buffer stage 60 converts the input data on line 58 to its true and complement data, whereas the output buffer stage 66 reverses the signal conversion process of the input buffer 60.

On the other hand, an output buffer stage 66 receives one of the its inputs via line 68 from the upper multiplexing stage 54 and receives its other input 70 from the other or lower multiplexing stage 50. The output buffer stage 66 thus operates to convert the 0.0 to 3 volt logic swing on lines 68 and 70 during a reading operation for the DRAM 10 to 0.0 to 5 volt logic swing on the pull up and pull down output lines 71 and 73. The pull up and pull down output lines 71 and 74 are connected as shown to drive the DQ output driver stage 56 in the manner described below. This switching action is accomplished without introducing any crossing currents into the output signal applied to the DQ output stage 56 and further without introducing any time delays into this switching operation to thereby optimize the access circuit switching speeds.

Turning now more specifically to the operation of the DRAM system shown in FIG. 1, if the row select line B (or line 36) goes high, then the MOS transistor 14 will turn on, and the charge from the storage capacitor 18 will be transferred to the line 26, which is the same as node 22. At the same time, the row select line 34 will not be turned on, so that the line 24 will be at its previous state. The sense amplifier 28 operates to detect the difference between the voltage levels on the digit and digit * lines 24 and 26, and the sense amplifier operates to amplify this difference in voltage levels on lines 24 and 26. This amplified voltage difference is then applied to the two select MOS transistors 42 and 44. Subsequently, when a "select" voltage is applied to gates 38 and 40 of the two MOS select transistors 42 and 44, this enables the amplified voltage difference from the sense amplifier 28 to pass into the flip flop 46.

The flip flop 46 in turn functions as a latch, and it latches the signal difference received from the select transistors 42 and 44. The flip flop 46 further amplifies the differential signal received from the select transistors 42 and 44 and then applies this amplified output signal through the global input/output (GIO) lines 48 and 52 to one of the four inputs of each of the two multiplexing (MUX) stages 50 and 54. The other three (3) inputs indicated for each MUX stage 50 and 54 would go to other parts of the row and column DRAM array 10, so that the block 10 in FIG. 1 really represents only one-fourth (¼) of the DRAM storage capacity. Based upon the address of the read data, the multiplexing stages 50 and 54 operate to select one of the four inputs shown, which in this case will be the complementary amplified signals on lines 48 and 52. These signals, in the case of a read operation, will be passed through the output lines 68 and 70 to the output buffer stage 66 described below.

During a write cycle for the system shown in FIG. 1, the output buffer 66 is turned off, and the data output from stage 56 is passed via line 58 into the input buffer 60 and differentiated in the input buffer 60. One of the two output lines 62 and 64 is high and the other of these output lines is low. The signal on output line 62 is applied to multiplexing stage 54 and the signal on output line 64 is applied to multiplexing stage 50. The multiplexing stages 50 and 54 will now take the high/low input data on lines 64 and 62 and then determine which of the four output lines, shown to the left of boxes 50 and 54 that the data should be driven on, e.g. 48 and 52 in the present example. This high/low data is then passed directly through the flip flop 46 and then through the select MOS gates 42 and 44 and then used to drive the digit and digit , lines 24 and 26. Then, one of the row select lines 34 or 36 will be turned on to allow the charge now written on lines 24 and 26 to be stored in the DRAM array 10. Thus, in the write cycle, the flip flop 46 merely operates to pass the data through to the digit lines 24 and 26, and there need not be any amplification function by the sense amplifier 28 in the write cycle.

Referring now to FIG. 2, the schematic buffer circuitry 66 shown in this figure includes the various gates, transistors, amplifiers, and level translator as indicated by the bracket 66, whereas the output DQ driver stage 56 is indicated by the right side bracket 56. The output driver stage 56 is connected to receive the pull up and pull down 0.0 to 5 volt logic swings which have been level translated in the output buffer stage 66 described below.

The $DQ_{in}$ and $\overline{DQ}_{in}$ signals received on lines 68 and 70 from the multiplexer stages 50 and 54 are connected, respectively, as the two inputs 68 and 70 to a pair of input NAND gates 74 and 72. The second inputs for the input NAND gates 72 and 74 are connected via a common line 76 to a strobe input signal ER. The output lines 78 and 80 for each of the input NAND gates 74 and 72 are connected, respectively, to a pair of cross coupled NAND gates 82 and 84, and the output line 86 from the lower of the two cross coupled NAND gates 82 is connected as one input to an output NOR gate 88. Similarly, the output line 90 from the upper cross coupled NAND gate 84 is connected as one input to a second output NOR gate 92. An enable signal is applied as shown via line 94 through an inverter 96 and via lines 98 and 100 as second inputs, respectively, to the output NOR gates 88 and 92 and operates to enable these NOR gates 88 and 92 for signal generation in a well known manner.

During a reading operation for the DRAM array 10 in FIG. 1 and with strobe input signal ER and the enable signal being applied, respectively, via lines 76 and 94 to the output buffer logic circuitry on the left hand side of FIG. 2, the output NOR gates 88 and 92 will operate to switch between the lower logic levels of 0.0 and 3 volts as the $DQ_{in}$ and $\overline{DQ}_{in}$ signals are similarly switched between their two logical levels. The output 3 volt signal on the output control line 102 from the output NOR gate 92 is designated as the +3 volt pull up voltage and is applied via a first or upper control line 102 to a level translator stage 104 where it is shifted by 2 volts up to a 5 volt level. Thus, when the logic level swings to +3 volts on line 102 as a positive input to the level translator stage 104, the output signal on line 108 from the level translator stage 104 swings from 0.0 to 5 volts and is applied via gate 109 of MOS transistor 110. This MOS transistor 110 is connected in series with MOS driver transistor 112 between a $V_{cc}$ voltage supply of 5 volts at node 114 and ground 116.

Referring now particularly to the control latch and logic gate circuitry indicated within the dotted line functional block 65 in FIG. 2, the $DQ_{in}$ and $\overline{DQ}_{in}$ signals on lines 68 and 70 from the two multiplexer stages 54 and 50, respectively, shown in FIG. 1 will now be determined. When beginning a read cycle, the latch input signal, ER, on line 76 to the two NAND gates 74 and 72 swings high allowing the $\overline{DQ}_{in}$ signal on line 70 to pass through the NAND gate 72 where it is inverted and passed to the output line 80. Similarly, the $DQ_{in}$ signal on line 68 now passes through the NAND gate 74 and appears inverted on line 78. Continuing, the high and low signals on lines 78 and 80 also pass through the NAND gates 82 and 84 and are inverted therein. The signals on lines 86 and 90, in turn, are fed back via the cross coupling lines shown to the other two inputs of these two NAND gates 82 and 84.

At this point, the latch signal ER goes to a zero (0), thereby forcing lines 78 and 80 both now to go high, so that if the output of the NAND gate 82 had been low, this low signal is fed back as a second input to the NAND gate 84 and thereby holds line 90 high, regardless of the state of the $DQ_{in}$ and $\overline{DQ}_{in}$ signals coming in. Thus, with the latch signal ER now low, the above signal condition is held on the output lines 86 and 90 regardless of what happens on the $DQ_{in}$ and $\overline{DQ}_{in}$ lines 68 and 70. Once the data on lines 86 and 90 is valid, the enable signal on line 94 is brought high and is then inverted to a low level by the inverter stage 96 and is then applied via line 98 to the output NOR gates 88 and 92. Thus, when the low output signal on line 98 from the inverter stage 96 is applied as second inputs to the two NOR gates 88 and 92, this then allows the signals on lines 86 and 90 to pass through and be inverted in these two NOR gates 88 and 92 to the two output lines 102 and 118. Thus, in summary, the logic gate and latch circuit arrangement shown at 65 in FIG. 2 merely operates as a latch so that the outputs 102 and 118 are held low when the data input on lines 68 and 70 is being determined. Thereafter, the ER latch signal on line 76 goes low, and the enable signal on line 94 goes high to invert and transfer the determined data on lines 68 and 70 to the two output control lines 102 and 118.

For the extended data out (EDO) mode of operation, the enable signal on line 94 will stay high, so that in this case the data on lines 90 and 86 will always invert and pass through to the outputs of the two output NOR gates 92 and 98, respectively. Also, in the EDO mode of operation, the ER latch signal on line 76 is modified to just be a pulse, so that the ER latch signal on line 76 pulses high only when the data is ready to be switched from one access read cycle to another. Therefore, what happens here is that some data is read and it is passed through the control logic latch stage 65, and while the next set of data is being read, then line 76 will be low until the $DQ_{in}$ and $\overline{DQ}_{in}$ signals on lines 68 and 70 are again valid. Thereafter, line 76 is pulsed high and low again to pass this new data through to the output lines 102 and 118. Thus, in the extended data out mode of operation, the latch stage 65 operates to isolate the valid data on lines 102 and 118 from the input DQs on lines 68 and 70, may be switching.

The complementary logic swing appearing on the output line 118 from the other output NOR gate 88 is connected as one input to an enable NAND gate 120. As used herein, the term "upper control lines or path" refers to all of the upper control circuitry connected via line 102 between the output of NOR gate 92 and the gate 136 of the pull up MOS output transistor 138 to be described. The term "lower control line or path refers to all of the lower control circuitry connected via line 118 between the output of the NOR gate 88 and the gate 146 of the output pull down transistor 148. Therefore, these upper and lower control lines or paths are connected within each read "channel" as this latter term is used herein, and the DRAM access circuitry will typically include sixteen (16) of these read channels.

The other input 122 to the NAND gate 120 in the lower control line or path is connected from the output of a NOR gate 126. This NOR gate 126 in turn receives its input signal from the output line 129 of an inverter 128. Invertor 128 receives its signal from a first upper output line 108 at level translator 104. The second input of NOR gate 126 being the output line 102. A second upper output line 106 from the level translator stage 104 is connected to apply a DC bias voltage to the gate 135 of the upper load transistor 132 in the output driver stage 56. The common output node 134 of the two serially connected MOS load and driver transistors 110 and 112 is connected as a pull up input voltage at the gate 136 of the pull up output transistor 138. The output line 108 is connected to the gate 109 of driver transistor 110, and the output line 122 of NOR gate 126 is connected to the input of driver transistor 112.

In the lower control line between NOR gate 88 and output node 150, the output signal on line 140 from the enable NAND gate 120 is connected through an inverter 142 and via line 144 as a pull down logic swing or voltage at the gate 146 of the pull down output transistor 148. Thus, the pull up output transistor 138 and the pull down output transistor 148 are serially connected at output node 150. The output data is driven to output node 150.

OPERATION

In operation, as the output signal on line 108 connected to the gate of the MOS load transistor 110 swings from a high to a low logic level, this action turns on the MOB load transistor 110 thereby connecting a $V_{cc}$ of 5.0 volts to the gate 136 of the MOS pull up transistor 138. This switching action turns on MOS transistor 138 and in turn drives the output signal on the output node 150 high in this case to 3 volts. On the other hand, when the logic swing on line 108 swings from a low logic level to a high logic level, this causes the MOS load transistor 110 to turn off, thereby turning off the pull up transistor 138. This low to high logic swing on line 108 is also applied through the inverter 128 to the NOR gate 126, thereby causing the output of the NOR gate 126 to swing high and be applied by way of line 122 to the NAND gate 120.

This high logic swing applied via line 122 to the enable gate 120 in conjunction with the high on line 118 produces a low output signal from the AND gate 120 which is applied via line 140 to the inverter 142 in the second control line or path. This causes a high output signal on line 144 which is applied to the gate 146 of the pull down transistor 148 and which turns on the output pull down transistor 148 only after the pull up output transistor 138 has been turned off, thereby driving the output node 150 to ground potential. Thus, the above switching action is seen to first drive the output node 150 to $V_{cc}$ in this case $V_{cc}$ is 3 volts when the output signal on line 108 swings low, and then to drive the pull down MOS transistor 148 to conduction when the output signal on line 108 from the level translator stage 104 is driven high. The 3 volt $V_{cc}$ on line 144 needed to turn on the output pull down transistor 148 is not shown in FIG. 2, but is actually part of the inverter stage 142 which is connected just like the two transistors 110 and 112 are connected in the inverter stage 111 in the upper control line previously described.

The output voltage on the upper line 106 from the level translator 104 is a positive DC supply voltage which will vary slightly in DC level for the two logic states and operates to apply the appropriate level of DC bias to the gate electrode 135 of the output MOS load transistor 132.

Therefore, this positive going voltage on line 108 turns on the pull down output transistor 148 only after the pull up output transistor 138 is completely turned off. This operation in turn ensures that the pull up and pull down output transistors 138 and 148 are never conducting simultaneously, thereby completely eliminating any possibility of crossing currents at the output node 150 of the output driver stage 56. Simultaneously, the switching delays in this DRAM read circuitry are held to an absolute minimum since no fixed time delays are required in parallel with the level translator stage 104 as was the case in the prior art discussed above.

Inverter 128, inverter input line from translator 104, line 129, NOR gate 126, NOR gate input line 102, line 124, and input 122, are also in unison or in combination referred to as 1) an enable circuit, device, or means, 2) a delay circuit device, or means, or 3) a timing circuit, device, or means. One skilled in the art will easily understand that the purpose of these identified elements serve the key function of ensuring that the pull-up part of the driver 56 is turned off before the pull-down transistor of the driver is fully activated.

It is noted that pull-up signal line in FIG. 2 is actually two lines leading to transistor gates 135 and 136. However, these two lines are also referred to as a single pull-up signal line in a general sense that they act in cooperation to effect the pull-up signal control for driver 56.

The following is a more detailed explanation of the operation of the circuit of the invention explained above. This more detailed explanation is provided to aid the reader in his or her understanding of the invention.

The signal on line 102 is the complement of the signal on line 118. The signal on line 102 is level translated in level translator 104 to desired voltage levels. The potential on line 108 is the complement of the potential on line 102 having been inverted by the level translator. The potential on line 106 fluctuates but remains at a high logic level capable of actuating transistor 132.

When the potential of line 102 has a high logic state the potential of line 118 has a low logic state. The low on line 118 takes the output potential of NAND gate 120 to a high logic state which is then inverted in at the gate 146 of transistor 148. The low on gate 146 deactuates transistor 148 isolating node 150 from the ground potential.

At the same time the high logic state on line 102 is inverted in the level translator 104 and the potential of line 108 has a low logic state which actuates the P-type transistor 110. The high logic state on line 102 is also an input to NOR gate 126 which creates a low on line 122. The low potential on line 122 deactuates transistor 112. Thus node 134 is pulled to Vcc, typically 5 volts, through actuated transistor 110. Transistor 138 is actuated by the high potential on node 134 which is connected to gate 136. The potential of node 150 is pulled to Vcc, typically 5 volts, through actuated transistors 132 and 138.

Now when the potential of line 102 transitions low, the NOR gate is enabled by the low on line 102, and the potential of line 118 transitions high enabling NAND gate 120. The low on line 102 is inverted in the level translator and line 108 transitions high deactuating transistor 110. The high on line 108 is inverted in inverter 128 driving the output of the enabled NOR gate 126 high to actuate transistor 112 and drive node 134 to a low potential. The low on node 134 deactuates transistor 138 isolating node 150 from Vcc. The high on line 122 drives the output of the enabled NAND gate 120 low. The low NAND gate output signal is inverted in inverter 142 and actuates transistor 148. Transistor 138 has already been deactuated before transistor 148 is actuated virtually eliminating cross over current. The actuation of transistor 148 and the deactuation of transistor 138 occurred in response to the signal at NOR gate 126 transitioning high. Therefore fixed time delay circuits are not required to eliminate the crossing current.

Various modifications may be made in and to the above described preferred embodiment without departing from the spirit and scope of this invention. For example, the claims herein are not limited to DRAM applications and may apply to other and different types of memories and peripheral circuitry used therewith. Also, the logic levels used are not limited to the 0.0 to 3 and 0.0 to 5 volt logic swings described herein. For example $V_{cc}$ on node 114 my be 7 volts and the level translator 104 may generate a 7 volt potential on line 106. In this case, the $V_{cc}$ connected to transistor 132 would be 5 volts and 5 volts would be driven to node 150 when transistors 132 & 138 are on gates 135 & 136, respectively. Nor is the output buffer stage in FIG. 2 limited to either the specific input logic gate connections to the left hand side of this figure or to the specific level translation and associated drive circuitry as shown connected between the output lines 102 and 118 from the input logic switching circuitry and the inputs to the output driver stage 56. Furthermore, the present invention is applicable equally to positive and negative logic swings and may be used with many types of system variations in the functional block diagram in FIG. 1 used for accessing the DRAM array 10. Accordingly, these and other design modifications are clearly within the scope of the following appended claims.

We claim:

1. A system for eliminating crossing currents and minimizing switching delays in a dynamic random access memory operation wherein two logic paths are operative with a given logic swing, a level translating stage is connected in a first logic path and to a pull up output driver transistor in an output driver stage, and a parallel signal processing path is connected as a second logic path and an input of a pull down output transistor in said output driver stage, characterized by: means connected between said level translating stage and said parallel signal processing path for enabling the operation of said parallel signal processing path by an output signal from said level translating stage to thereby ensure that said pull down output transistor is turned on immediately after said pull up output transistor turns off, but not before;

said enabling means includes an enable gate having one input connected in said second logic path and another input connected to an output of said level translating stage to thereby generate an enabling output signal applied to said pull down output transistor only after said pull up output transistor turns off; and one output line from a level translating stage is connected through an inverter to said pull up output transistor and another output line from said level translating stage is connected through an inverter and then through a logic gate where an inverted signal is combined with an input signal to said level translating stage, and an output line from said logic gate is connected as one input to said enable gate, whereby an output signal from said enable gate may be inverted and applied to said pull down output transistor.

2. Access circuitry for driving serially connected pull up and pull down output transistors to generate an output logic swung which has been up converted from a smaller input logic swing, including, in combination:

a) a level translator stage connected to receive a small pull up logic swing and operative to convert it to a larger output logic swing;

b) applying means connected between said level translator stage and said pull up output transistor for applying an output logic swing to said pull up output transistor;

c) an enable gate connected between said level translator stage and said pull down output transistor, whereby said enable gage is operative to turn on said pull down output transistor only after a logic swing output from said level translator stage changes levels to thereby turn off said pull up output transistor, thereby eliminating crossing current in the series circuit output connection containing said pull up and pull down output transistors;

d) said level translator stage and said enable gate are connected, respectively, in parallel signal processing paths of a read data processing channel for a DRAM; and e) one output line from said level translator stage is connected through the applying means to said pull up output transistor and another output line from said level translator stage is connected through an inverter and then through a logic gate where an inverted signal is combined with an input signal to said level translator stage, and an output line from said logic gate is connected as one input to said enable gate, whereby an output signal from said enable gate may be inverted and applied to said pull down output transistor.

3. A dynamic random access memory device having an output buffer electrically coupled to an output driver, said output buffer having an output node, comprising:

a) a control latch device, being part of the output buffer, for receiving output buffer input signals and for generating a first output signal at a first output node, said first output signal for sending a pull up signal to the output driver via a level translator device, said pull up signal driving a first potential to said output node of said output buffer, and for generating a second output signal at a second output node, said second output signal for sending a pull down signal to the output driver via a first logic device, said pull down signal driving a second potential to said output node of said output buffer, said first and said second output signals generated in response to said output buffer input signals; and b) an enabling device, electrically coupled at an input node to an output node of the level translator and electrically coupled from an output node to an input node of the first logic device, said enabling device enabling the pull down signal to reach the output driver only after the pull up signal has been discontinued from the output driver.

4. A dynamic random access memory device, comprising:

a) an output driver, having a pull-up circuit, a pull-down circuit, and an output node;

b) an output buffer for accepting a pull-up condition and a pull-down condition, said output buffer electrically coupled to the output driver;

c) a level translator located in the output buffer and responding to the pull-up and pull down conditions to generate a level translator signal at a level translator output node, said level translator signal coupled to said pull-up circuit; and d) a timing device located in the output buffer and having an input node coupled to said level translator output node and having a first output node electrically coupled to the pull-up circuit and having a second output node electrically coupled to the pull-down circuit, said timing device responding to said level translator signal to generate a first timing signal at said first output node to deactivate said pull-up circuit thereby terminating a driving of a first potential to said output node of said output driver and responding to said level translator signal to generate a second timing signal at said second output node to activate said pull-down circuit thereby driving said output node of said output driver to a second potential, said timing device timing a generation of said first and said second timing signals such that said pull-up circuit is deactivated prior to said pull-down circuit being activated.

5. A dynamic random access memory device, comprising:

a) an output driver having a pull-up device, a pull-down device, and an output node interposed between said pull-up device and said pull-down device, a first potential driven to said output node through said pull-up device in response to an active pull-up signal on a control input of said pull-up device and in response to an inactive pull-down signal on a control input of said pull-down device, a second potential driven to said output node through said pull-down device in response to an inactive pull-up signal on said control input of said pull-up device and in response to an active pull-down signal on said control input of said pull-down device;

b) a control circuit in electrical communication with said output device circuit, wherein said control circuit generates said active and inactive pull-up control signals and generates said active and inactive pull-down signals, said control circuit accepting a first data signal at a first input and a second data signal at a second input; and c) a level translator circuit, an output of said level translator circuit in electrical communication with a third input of said control circuit, said level translator circuit accepting said first data signal and generating a level translated signal to said control circuit at said third input, wherein said active pull-up signal is generated in said control circuit in response to a said first data signal having a first logic state and in response to said level translated signal, and wherein said inactive pull-down signal is generated in said control circuit in response to said second data signal having a second logic state, and wherein said inactive pull-up signal is generated in said control circuit in response to said first data signal having a second logic state and in response to said level translated signal and wherein said active pull-down signal is generated in said control circuit in response to said first data signal having said second logic state, in response to said level translated signal and in response to said second data signal having said first logic state, said control circuit controlling a timing of the generation of said inactive pull-up signal and said active pull-down signal such that said active pull-up signal becomes inactive before said inactive pull-down signal becomes fully active.

6. The dynamic random access memory device of claim 4, wherein said pull-up condition comprises a first signal and a second signal said first and said second signals capable of having first and second logic states, and wherein said pull-down condition comprises a third signal and a fourth signal said third and said fourth signals capable of having said first and second logic states.

7. The dynamic random access memory device of claim 6, where the timing device comprises:

a) an inverter coupled to the output from the level translator output node and generating an inverter output signal;

b) a first logic device receiving said inverter output signal at a first input node and receiving one of said signals of said pull-up condition and said pull-down condition at a second input node, said first logic device generating a first logic signal in response to said pull-up condition to control the activation of said pull-up circuit and generating a second logic signal in response to said pull-down condition and said translator signal to control a deactivation of said pull-up circuit; and c) a second logic device for receiving an output of said first logic device and one of said signals of said pull-up and pull-down conditions, said second logic device generating a third logic signal in response to said pull-up condition to control the deactivation of said pull-down circuit and generating a fourth logic signal in response to said second logic signal and said pull-down condition to control the activation of said pull-down circuit.

*8. A system for minimizing switching delays in a memory device outputting a data signal and its compliment signal through first and second respective logic paths, the first logic path including a level translating stage for receiving the data signal and selectively activating a pull up output driver transistor in response thereto, the second logic path including a pull down output driver transistor, the system comprising:*

*an enable gate for receiving the compliment signal through the second logic path and being enabled in response thereto to selectively activate the pull down output driver transistor, the enable gate being adapted to receive a control signal directing it to activate the pull down output driver transistor if enabled; and*

*an inverter and a logic gate coupled in combination between the level translating stage and the enable gate for providing the control signal to the enable gate in response to the level translating stage de-activating the pull up output driver transistor.*

*9. Access circuitry in a memory device for driving pull up and pull down output transistors to generate an output logic swing from an input logic swing, the access circuitry comprising:*

*a level translator stage for receiving a pull up portion of the input logic swing and converting it to a pull up portion of the output logic swing;*

*an applying circuit coupled to the level translator stage for applying the pull up portion of the output logic swing to the pull up output transistor to selectively activate the pull up output transistor;*

*an enable gate coupled to the level translator stage for activating the pull down output transistor only after a pull down portion of the input logic swing enables the enable gate and in response to a control signal; and*

*an inverter and a logic gate coupled in combination between the level translator stage and the enable gate for providing the control signal thereto in response to the level translator stage outputting a pull up portion of an output logic swing that de-activates the pull up output transistor.*

*10. A memory device having an output buffer electrically coupled to an output driver, said output buffer having an output node, the memory device comprising:*

*a control latch device included in the output buffer for receiving output buffer input signals and for generating first and second complimentary output signals in response;*

*a level translator device coupled to the control latch device for receiving the first output signal and generating a pull up signal in response thereto to drive a first potential to said output node of said output buffer;*

*a logic device coupled to the control latch device for receiving the second output signal and generating a pull down signal in response thereto when enabled to drive a second potential to said output node of said output buffer; and*

*an enabling device coupled to the level translator device, the control latch device, and the logic device for enabling the pull down signal to reach the output driver only after the pull up signal has been discontinued from the output driver.*

*11. The memory device of claim 10 wherein the enabling device comprises a NOR gate.*

*12. The memory device of claim 10 wherein the logic device comprises a NAND gate.*

*13. The memory device of claim 10 further comprising a CMOS driver inverter interposed between the level translator device and the output buffer's output node.*

*14. The memory device of claim 10 wherein the output driver includes a pull up transistor and a pull down transistor.*

*15. A memory device comprising:*

*an output driver having a pull-up circuit, a pull-down circuit, and an output node;*

*an output buffer for accepting a pull-up condition and a pull-down condition, said output buffer coupled to the output driver;*

*a level translator located in the output buffer and responsive to the pull-up and pull down conditions to generate a level translator signal for said pull-up circuit; and*

*a timing device located in the output buffer and coupled to said level translator, the pull-up circuit, and the pull-down circuit, said timing device responsive to said level translator signal to generate first and second timing signals, said first timing signal for deactivating said pull-up circuit to terminate a driving of a first potential to said output node, said second timing signal for activating said pull-down circuit to drive said output node to a second potential, said timing device adapted to time its generation of said first and said second timing signals such that said pull-up circuit is substantially deactivated prior to said pull-down circuit being activated.*

*16. The memory device of claim 15, wherein the timing device comprises:*

*an inverter coupled to the level translator for receiving said level translator signal and generating an inverter output signal in response thereto;*

*a first logic device for receiving said inverter output signal and responsive to said pull-up condition and said pull-down condition to generate a first logic signal in response to said pull-up condition to control the activation of said pull-up circuit and to generate a second logic signal in response to said pull-down condition and said translator signal to control a deactivation of said pull-up circuit; and*

*a second logic device for receiving said second logic signal from said first logic device and responsive to one of said pull-up and pull-down conditions to generate a third logic signal in response to said pull-up condition to control the de-activation of said pull-down circuit and to generate a fourth logic signal in response to said second logic signal and said pull-down condition to control the activation of said pull-down circuit.*

*17. A memory device comprising:*

*an output driver having a pull-up device, a pull-down device, and an output node interposed therebetween, said output driver being adapted to drive a first potential to said output node through said pull-up device in response to an active pull-up control signal and an inactive pull-down control signal, said output driver also being adapted to drive a second potential to said output node through said pull-down device in response to an inactive pull-up control signal and an active pull-down control signal;*

*a control circuit in electrical communication with said output driver, said control circuit for generating said control signals in response to first and second data signals and a level translated signal such that one of said pull-up and pull down devices is substantially inactive when the other is active; and*

*a level translator circuit in electrical communication with said control circuit for providing said level translated signal in response to said first data signal.*

*18. A circuit in an output buffer for activating a first output driver switch only after a second output driver switch is substantially de-activated, the second output driver switch being activated through a first inverter by a level translating stage in response to a data signal received by the level translating stage, the circuit comprising:*

*an enable gate for activating the first output driver switch in response to an activation signal after being enabled by a compliment signal, the compliment signal being the compliment of the data signal; and*

*a second inverter and a logic gate coupled in combination between the level translating stage and the enable gate for providing the activation signal thereto in response to the level translating stage de-activating the second output driver switch.*

*19. The circuit of claim 18 wherein the enable gate comprises a NAND gate and the logic gate comprises a NOR gate.*

*20. An output buffer for outputting an output signal in response to a data signal and its compliment signal, the output buffer comprising:*

*a pull-up output driver switch for selectively outputting the output signal equal to a supply voltage;*

*a pull-down output driver switch for selectively outputting the output signal equal to a reference voltage;*

*a level translating stage and a first inverter coupled in combination to the pull-up output driver switch for activating and de-activating the pull-up output driver switch in response to the data signal;*

*an enable gate coupled to the pull-down output driver switch for activating the pull-down output driver switch in response to an activation signal after being enabled by the compliment signal; and*

*a second inverter and a logic gate coupled in combination between the level translating stage and the enable gate for providing the activation signal thereto in response to the level translating stage de-activating the pull-up output driver switch.*

*21. The output buffer of claim 20 wherein the output driver switches comprise MOS transistors, wherein the first*

*inverter comprises a CMOS inverter, wherein the enable gate comprises a NAND gate, and wherein the logic gate comprises a NOR gate.*

*22. The output buffer of claim 20 further comprising a control latch coupled to the level translating stage and the enable gate for providing the data and compliment signals thereto, respectively.*

*23. A memory device comprising:*

*a memory array; and*

*access circuitry coupled to the memory array for accessing the memory array, the access circuitry including an output buffer for outputting an output signal in response to a data signal and its compliment signal, the output buffer comprising:*

*a pull-up output driver switch for selectively outputting the output signal equal to a supply voltage;*

*a pull-down output driver switch for selectively outputting the output signal equal to a reference voltage;*

*a level translating stage and a first inverter coupled in combination to the pull-up output driver switch for activating and de-activating the pull-up output driver switch in response to the data signal;*

*an enable gate coupled to the pull-down output driver switch for activating the pull-down output driver switch in response to an activation signal after being enabled by the compliment signal; and*

*a second inverter and a logic gate coupled in combination between the level translating stage and the enable gate for providing the activation signal thereto in response to the level translating stage de-activating the pull-up output driver switch.*

*24. The memory device of claim 23 wherein the output driver switches comprise MOS transistors, wherein the first inverter comprises a CMOS inverter, wherein the enable gate comprises a NAND gate, and wherein the logic gate comprises a NOR gate.*

*25. The memory device of claim 23 wherein the output buffer further comprises a control latch coupled to the level translating stage and the enable gate for providing the data and compliment signals thereto, respectively.*

*26. A method in an output buffer for activating a first output driver switch only after a second output driver switch is substantially de-activated, the second output driver switch being activated by a level translating stage in response to an active data signal received by the level translating stage, the method comprising:*

*receiving an active compliment signal, the compliment signal being the compliment of the data signal;*

*in response to the active compliment signal, enabling the first output driver switch to be activated by an activation signal; and*

*providing the activation signal in response to the level translating stage de-activating the second output driver switch.*

* * * * *